(12) United States Patent
Flitsch

(10) Patent No.: US 7,467,024 B2
(45) Date of Patent: Dec. 16, 2008

(54) METHOD AND APPARATUS FOR AN ELEVATOR SYSTEM FOR A MULTILEVEL CLEANSPACE FABRICATOR

(76) Inventor: Frederick A. Flitsch, 25 Twin Ponds Rd., New Windsor, NY (US) 12553

( * ) Notice: Subject to any disclaimer, the term of this patent is extended or adjusted under 35 U.S.C. 154(b) by 264 days.

(21) Appl. No.: 11/510,419

(22) Filed: Aug. 26, 2006

(65) Prior Publication Data

US 2007/0055404 A1 Mar. 8, 2007

Related U.S. Application Data

(60) Provisional application No. 60/596,053, filed on Aug. 26, 2005, provisional application No. 60/596,099, filed on Aug. 31, 2005, provisional application No. 60/596,173, filed on Sep. 6, 2005, provisional application No. 60/596,343, filed on Sep. 18, 2005.

(51) Int. Cl.
*G06F 19/00* (2006.01)
*B01L 1/04* (2006.01)

(52) U.S. Cl. .................. 700/112; 700/113; 700/114; 454/187

(58) Field of Classification Search ......... 700/112–114; 454/187
See application file for complete search history.

(56) References Cited

U.S. PATENT DOCUMENTS

| | | | |
|---|---|---|---|
| 3,158,457 A | 11/1964 | Whitefield | |
| 3,588,176 A | 6/1971 | Byrne et al. | |
| 3,603,646 A | 9/1971 | Leoff | |
| 3,812,947 A | 5/1974 | Nygaard | |
| 3,930,684 A | 1/1976 | Lasch, Jr. et al. | |
| 3,976,330 A | 8/1976 | Babinski et al. | |
| 4,081,201 A | 3/1978 | Hassan et al. | |
| 4,165,132 A | 8/1979 | Hassan et al. | |
| 4,278,366 A | 7/1981 | Loveless et al. | |
| 4,299,518 A | 11/1981 | Whelan | |
| 4,315,705 A | 2/1982 | Flint | |
| 4,348,139 A | 9/1982 | Hassan et al. | |
| 4,409,889 A | 10/1983 | Burleson | |
| 4,501,527 A | 2/1985 | Jacoby et al. | |
| 4,554,766 A | 11/1985 | Ziemer et al. | |
| 4,649,830 A | 3/1987 | Tanaka | |
| 4,667,579 A | 5/1987 | Daw | |
| 4,667,580 A | 5/1987 | Wetzel | |
| 4,682,927 A | 7/1987 | Southworth et al. | |
| 4,694,736 A | 9/1987 | Yamagata et al. | |
| 4,695,215 A | 9/1987 | Jacoby et al. | |
| 4,722,659 A | 2/1988 | Hoyt, III et al. | |
| 4,804,392 A | 2/1989 | Spengler | |
| 4,826,360 A | 5/1989 | Iwasawa et al. | |
| 4,840,530 A | 6/1989 | Nguyen | |
| 4,851,018 A | 7/1989 | Lazzari et al. | |
| 4,861,222 A | 8/1989 | Mirkovich | |
| 4,867,629 A | 9/1989 | Iwasawa et al. | |
| 4,875,825 A | 10/1989 | Tullis et al. | |
| 4,923,352 A | 5/1990 | Tamura et al. | |

(Continued)

*Primary Examiner*—Ronald D Hartman, Jr.
(74) *Attorney, Agent, or Firm*—J. P. Kincart

(57) ABSTRACT

The present invention provides methods and apparatus capable of routine placement and replacement of fabricator tools in a designated tool location. The tool location can be selected from multiple tool locations arranged in a matrix with horizontal and vertical designations. In another aspect, the fabricator tool placement and replacement can be accomplished while maintaining a clean space environment about the fabricator tool.

20 Claims, 6 Drawing Sheets

U.S. PATENT DOCUMENTS

| | | | |
|---|---|---|---|
| 4,963,069 A | 10/1990 | Wurst et al. | |
| 4,964,776 A | 10/1990 | Wakita et al. | |
| 5,029,518 A | 7/1991 | Austin | |
| 5,058,491 A | 10/1991 | Wiemer et al. | |
| 5,096,477 A | 3/1992 | Shinoda et al. | |
| 5,108,513 A | 4/1992 | Muller et al. | |
| 5,139,459 A * | 8/1992 | Takahashi et al. | 454/187 |
| 5,145,303 A | 9/1992 | Clarke | |
| 5,167,575 A | 12/1992 | MacDonald | |
| 5,344,365 A | 9/1994 | Scott et al. | |
| 5,425,793 A * | 6/1995 | Mori et al. | 55/385.2 |
| 5,518,451 A | 5/1996 | Renz et al. | |
| 5,562,539 A * | 10/1996 | Hashimoto et al. | 454/187 |
| 5,570,990 A * | 11/1996 | Bonora et al. | 414/543 |
| 5,795,356 A | 8/1998 | Leveen | |
| 5,848,933 A * | 12/1998 | Roberson et al. | 454/187 |
| 5,860,258 A | 1/1999 | Faith et al. | |
| 6,082,949 A * | 7/2000 | Rosenquist | 414/217 |
| 6,099,599 A | 8/2000 | Wu | |
| 6,138,721 A * | 10/2000 | Bonora et al. | 141/98 |
| 6,183,358 B1 * | 2/2001 | Adair, Jr. | 454/187 |
| 6,220,808 B1 * | 4/2001 | Bonora et al. | 414/217 |
| 6,238,283 B1 * | 5/2001 | Matsuyama et al. | 454/187 |
| 6,306,189 B1 | 10/2001 | Renz | |
| 6,322,597 B1 | 11/2001 | Ohta | |
| 6,328,768 B1 | 12/2001 | Ohta | |
| 6,574,937 B1 | 6/2003 | Rapisarda | |
| 6,582,178 B2 | 6/2003 | Petruccelli | |
| 6,598,279 B1 | 7/2003 | Morgan | |
| 6,612,084 B2 | 9/2003 | Rapisarda | |
| 6,736,582 B1 * | 5/2004 | Mages et al. | 414/217 |
| 6,854,583 B1 | 2/2005 | Horn | |
| 6,869,457 B2 | 3/2005 | Nakagawa | |
| 6,875,282 B2 * | 4/2005 | Tanaka et al. | 118/719 |
| 6,955,595 B2 | 10/2005 | Kim | |
| 7,014,672 B2 * | 3/2006 | Ishihara et al. | 55/356 |
| 7,039,999 B2 | 5/2006 | Tarr et al. | |
| 7,083,515 B2 | 8/2006 | Rapisarda et al. | |
| 7,257,458 B1 | 8/2007 | Markle | |
| 7,269,925 B2 | 9/2007 | Lam | |
| 2002/0025244 A1 * | 2/2002 | Kim | 414/217 |
| 2002/0129707 A1 * | 9/2002 | Tanaka et al. | 95/273 |
| 2004/0047714 A1 * | 3/2004 | Poli et al. | 414/281 |
| 2004/0187451 A1 * | 9/2004 | Suzuki et al. | 55/385.1 |
| 2008/0089765 A1 * | 4/2008 | Moriya et al. | 414/416.03 |

\* cited by examiner

METHOD AND APPARATUS FOR AN ELEVATOR SYSTEM FOR A MULTILEVEL CLEANSPACE FABRICATOR

CROSS REFERENCE TO RELATED APPLICATIONS

This application claims priority to the Provisional Application, Ser. No. 60/596,343, filed Sep. 18, 2005 and entitled: Specialized Methods for Substrate Processing for a Clean Space Where Processing Tools are Vertically Oriented; and also Provisional Application, Ser. No. 60/596,173, filed Sep. 6, 2005 and entitled: "Method and Apparatus for Substrate Handling for a Clean Space where processing tools are reversibly removable"; and also Provisional Application, Ser. No. 60/596,099, filed Aug. 31, 2005 and entitled: "Method and Apparatus for a Single Substrate Carrier For Semiconductor Processing; and also Provisional Application, Ser. No. 60/596,053 filed Aug. 26, 2005 and entitled: "Method and Apparatus for an Elevator System for Tooling and Personnel for a Multilevel Cleanspace/Fabricator". The contents of each are relied upon and incorporated by reference.

FIELD OF THE INVENTION

The present invention relates to apparatus and methods which support cleanspace fabricators, and in particular to an elevator system supporting vertical and horizontal arrangement of fabricator tools operating in cleanspace environments.

BACKGROUND OF THE INVENTION

Cleanspace fabricator designs have been disclosed in previous patent applications that teach an arrangement of disparate tools in both vertical and horizontal dimensions. In some particular embodiments, fabricators tools are arranged in close proximity, essentially in a matrix resembling a beehive design. Each fabricator tool is associated with a unique cleanspace and a work piece, such as a semiconductor substrate, is transported from one fabricator tool cleanspace to another. Self contained carriers for transporting the substrate from one fabricator tool to another have also been disclosed, as well automation for transporting such carriers. Such carriers can be designed to maintain a clean space environment for the substrate, and, in some embodiments, a carrier can also provide atmospheric control.

In some implementations, fabricators with vertically arranged tools and disparate cleanspace environments can be built into a building structure itself. In such implementations, it is feasible to use conventional means, such as building elevators and forklifts to transport fabricator tools. However, some implementations provide for standalone fabricators in an open space, with vertically arranged fabricator tools. Stand alone implementations pose additional challenges for installing and removing tools. In particular, it would be difficult, if not impossible to install or remove a fabricator tool while maintaining the tool in a clean space environment.

The present invention compliments such designs by providing transport of fabricator tools to and from a particular cleanspace. In some embodiments, the transport is accomplished while maintaining a cleanspace environment about the fabricator tool being transported, thereby preserving the integrity of the tool.

SUMMARY OF THE INVENTION

Accordingly, the present invention provides methods and apparatus for transporting a fabricator tool to or from a cleanspace environment within a work area module defined in three dimensions by walls. The work space module includes a connecting surface connectable to a tool location in a multilevel fabricator. The connecting surface can include a perimeter defining an opening in at least one wall containing the work area, wherein the opening is large enough to allow a fabricator tool to pass through the opening. A support structure can support the work area module and also include automation for transporting the work area module in at least one of a horizontal plane and a vertical plane. Each plane can be relative to the cleanspace environment. A seal can be present between the perimeter defining the opening and a surface of the cleanspace environment. The seal can be operative to preserve the integrity of an atmosphere defined by the cleanspace environment and an environment within the work area module.

The methods and apparatus can also include wheels mounted proximate to a lowest portion of the support structure which are functional to provide movement to the support structure in the horizontal plane. Mechanization can be attached to the wheels which is functional to elevate the work area module, thereby providing movement in the vertical plane.

Automation for transporting the work area module on a horizontal plane and a vertical plane can include multiple rails arrayed in a matrix along vertical and horizontal axes. A drive unit can be used which is operative to provide locomotion to the move the work area module along at least one rail. It should be understood that the work area module can include a clean room or other clean space.

Mechanized apparatus can be operative to position the fabricator tool in an operation location either automatically or under the direction of a human operator.

In another aspect, the work area module can also include utility support for at least one of: tool diagnosis and repair. The utility support can include, for example, supply of one or more of: electricity, inert gas flow, chemicals, and chemical drain tanks.

Some embodiments can also include, monitoring equipment and circuitry, such as, for example, fire detection and remediation equipment, chemical detection and remediation, fluid detection and remediation. the monitoring equipment can be located throughout the apparatus described, including, without limitation, the work area module additionally and a tool body location in a fabricator the work area module.

In still another aspect, automation for transporting a work area module in a vertical plane relative to the cleanspace environment can include, for example, a series of extension jacks activatable via motorized lead screw assemblies; automated hydraulic systems and stepper motors driving a system of cables and pulleys; and motorized arms with telescoping length capability.

Additional functionality included in some embodiments can include electronic circuitry which is functional to provide one or more of: wired or wireless electronic communication between at least two of: a fabricator in the work area module, a fabricator tool adjacent to the work area module and cleanspace fabricator automation. The electronic communication can also be functional to indicate a status of a fabricator tool to fab automation or other elevator machinery.

Still additional embodiments can include electronically interlocked safety systems which are functional to control the ability of a fabricator tool body to be moved into or out of the work area module at various positions. Electronic sensors can be mounted to a work area module and functional to monitor the environment of the work area module for the presence of one more of: the presence of chemicals, temperature, moisture, and electrical charge. A control panel can include user activatable controls. wherein said user activatable controls are operable to provide one or more of: vertical movement of the work area module and horizontal movement of the work area module. In some embodiments, identification apparatus can incorporate, for example, one or more of: a radio frequency identification tag and a scannable symbol to monitor and track fabricator tool location and elevator status and work area module location and status.

Other embodiments can include methods of facilitating placement of a fabrication tool in a fabricator by elevating a work area module and transporting the work area module in a horizontal plane to a tool location. A connecting surface can seal the work area module to a tool location in the fabricator. The seal can be sufficient to maintain a cleanspace environment about a fabricator tool while the fabricator tool is transported between the work space module and the tool location.

In still another aspect, the present invention can include performing at least one action contributing to the manufacture of one or more of: a semiconductor; photonic; microelectronic machines; biological composition and nanotechnology device.

Other aspects can include transporting a human operator to the tool location. Various embodiments can provide for transport of the human operator either within the work area module or in a portion of an elevator used to transport the work area module. A tool can be removed from a tool location into the work area module where the human operator of other individual can perform a repair on the tool in the work area module. The tool can also be replaced into the tool location.

Some embodiments can also provide for automatically controlling the position of a work area module in relation to a particular tool location and automatically placing a fabricator tool in a tool location and connecting one or more utility services to the fabricator tool, wherein the utility services include at least one of: electricity, inert gas flow, chemicals, and chemical drain tanks.

BRIEF DESCRIPTION OF THE DRAWINGS

The accompanying drawings, that are incorporated in and constitute a part of this specification, illustrate several embodiments of the invention and, together with the description, serve to explain the principles of the invention.

Figure 1:
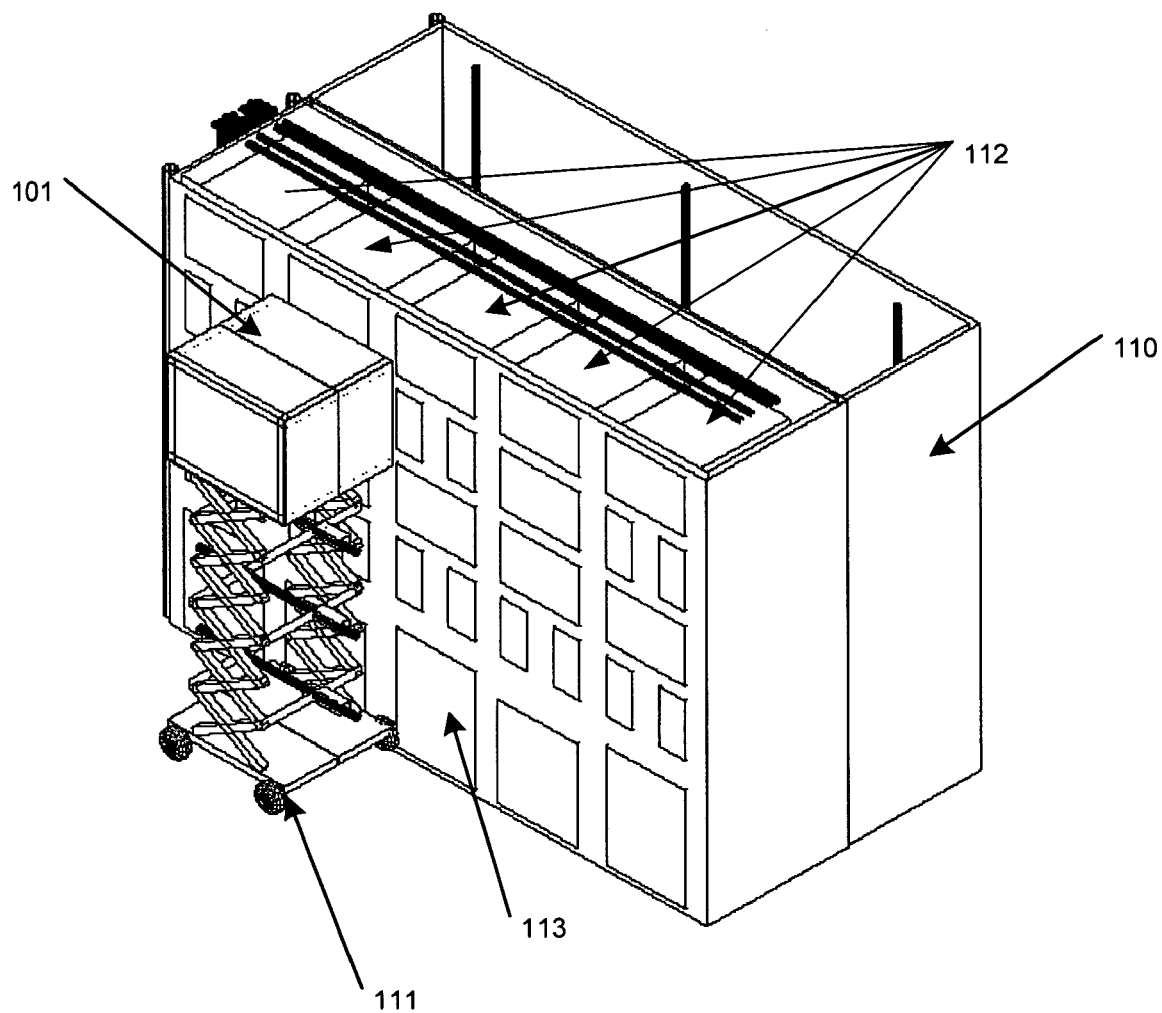
FIG. 1 illustrates a stand alone elevation cleanspace deployed next to a straight edged multilevel fab.

The accompanying drawings, that are incorporated in and constitute a part of this specification, illustrate several embodiments of the invention and, together with the description, serve to explain the principles of the invention:

DETAILED DESCRIPTION OF PREFERRED EMBODIMENTS

The present invention relates to methods and apparatus to support a cleanspace environment within which a material, such as an integrated circuit substrate, can be processed. In particular, according to the present invention, the support includes methods and apparatus which allow multiple fabrication tools used to process a material within the cleanspace to be arranged in a vertical and horizontal matrix. In some embodiments of the present invention, a portion of each fabrication tool can be made accessible from within a cleanspace in which the material is processed and an additional portion of each fabrication tool can be positioned within a separate cleanspace environment. A unique elevator is provided for transporting fabrication tools to and from various positions in the matrix and also allow for the fabrication tool to be placed into, or removed from, the matrix while maintaining the integrity of a cleanspace environment around the fabrication tool.

Reference will now be made in detail to different aspects of some preferred embodiments of the invention, examples of which are illustrated in the accompanying drawings. Wherever possible, the same reference numbers will be used throughout the drawings to refer to the same or like parts. A Glossary of Selected Terms is included at the end of this Detailed Description.

Traditionally, when installing a processing tool into a semiconductor fabricator, riggers had to place the tool in a designated position where the tool remained in place for its entire time in the fab. The present invention provides for an alternative strategy wherein processing tools can be routinely placed and removed from a fab location.

One aspect of the present invention therefore provides for support apparatus which facilitates efficient placement, removal and replacement of a processing tool in a predefined location. Predefined tool placement in turn facilitates predefined locations for utility interconnections and predefined locations for material transfer into and out of associated tool ports.

In some embodiments, a support fixture can further provide a chassis capable of receiving a processing tool and moving a processing tool from a position external to a cleanspace to an operational location. In some respects, movement of the tool from an installation position to an operational position can be envisioned much like a cabinet drawer moving from an outward position to a closed position.

Other aspects of some embodiments of the present invention include the connection of support items for proper operation of the processing tool. For example, electrical supplies, chemicals, gases, compressed air or other processing tool support can be passed through the tool chassis support system via flexible connections. Furthermore, the chassis body could support wired or wireless transfer of data. In addition, in some embodiments, a support chassis according to the present invention can include communication interfaces with safety systems to provide safe operation and safe removal and replacement.

It is the general intent of this invention to provide the physical framework for the support of locating processing tools in a fab where the tools are placed and replaced with some frequency and most or all of the tools are accessible from the exterior of the fabricator cleanspace. One aspect of a design that accomplishes these goals includes stacking tools in a vertical dimension to form a matrix. The scope of the present invention can include a matrix of a single column of fabrication tools ascending in a vertical dimension or a matrix including multiple columns of fabrication tools which adds horizontal dimension greater than one. The present invention supports both matrix designs with methods and apparatus which provide a cleanspace elevator that can lift tool bodies multiple levels in a clean environment. In various embodiments, the cleanspace elevator also provides transport in a horizontal dimension and maintains a clean space environment around a fabricator tool being transported.

In FIG. 1, various aspects of this invention are illustrated. An elevator body 101 is indexed on a $4^{th}$ level of a multilevel cleanspace fabricator 110 at the second major tool location in the horizontal dimension. A fabricator 110 is therefore illustrated of a type where each tool body (not illustrated in FIG. 1) is located in a disparate cleanspace 112.

According to some embodiments, each clean space 112 and corresponding tool body contained therein has a corresponding access panel 113 which can be removed to facilitate work on the corresponding tool body or replace the entire tool. In order to support such an arrangement, a mobile cleanspace 101 is provided which can be elevated and positioned proximate to a particular fabricator tool and corresponding cleanspace. The elevator can move in the horizontal dimension by a motor driven set of wheels as shown by item 111.

Figure 4:
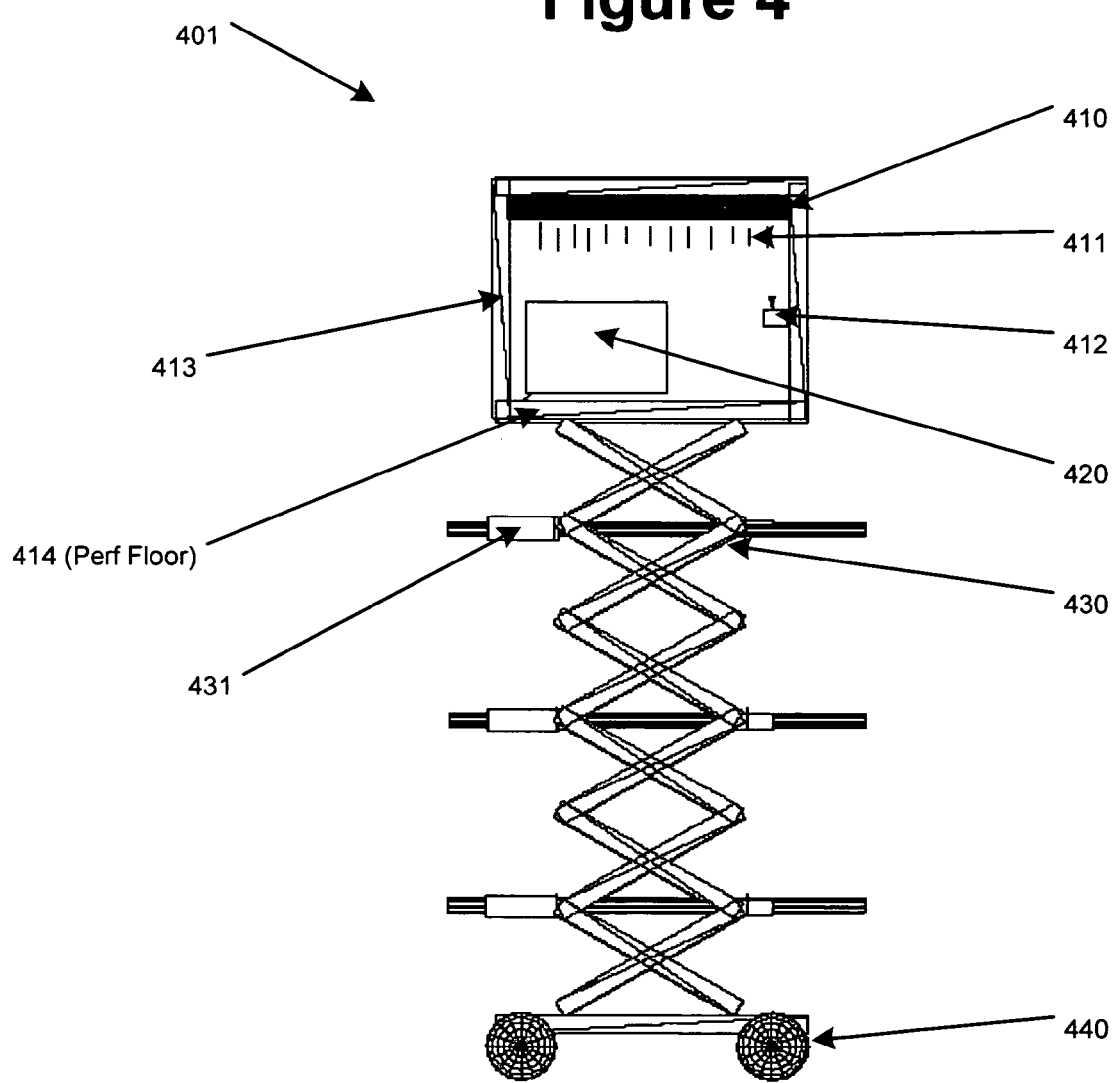
FIG. 4 illustrates a close up view of internal aspects of elevation cleanspace.

Referring now to FIG. 4, a close up view including various aspects of as elevated cleanspace 401, sometimes referred to as a work area module, is illustrated. The work area module can have a box like body 410 defined in three dimensions by walls. The interior can be maintained as a cleanspace area according to industry standards. For example, a HEPA filter based clean room ceiling can provide laminar type air flow 411, and a perforated floor 414, to allow for flow of air out of the elevated clean room. Controls can be situated inside the work area module 401 which a human operator inside the work area module 401 can use to control elevation and movement of the in the horizontal direction.

In some embodiments, the area inside the work area module 401 can be sufficient for two or more tool bodies, 420, so that a tool body 420 being replaced can be removed from its place and a replacement tool body 420 can be placed in the tool location cleanspace.

In some embodiments, elevation can be performed with mechanical structure operating on the principal of a scissor-jack 430, such as, for example, via individual lead screw motors, 431. Some embodiments can also include horizontal motion controlled via electric motors connected to a wheel based drive train, 440. Other embodiments can include a rail system which guides a work space module to a tool location via matrix of rails positioned in horizontal and vertical directions relative to the tool location.

In another aspect, walls of the cleanspace which include an opening 413, can be fitted with edge seals which can allow the elevator to be pushed against the fabricator to maintain a level of air cleanness when the vertical laminar flow air was actuated.

It can be natural for the evolution of the design of such an elevator space to accommodate various types of support facilities. These can include the electric power to not only run the elevator and cleanspace equipment but to potentially power elements of the tool bodies and testing/diagnostic equipment which can be incorporated into the elevator body. And, there can be automation capabilities incorporated into the elevator for transfer of data from tool bodies and test systems and the control equipment of the elevator itself to external automation systems, for example of the fab or of the tool bodies in the fab. Furthermore, since the operation of processing equipment involves various high energy sources, it can be natural for the elevated space to accommodate other safety apparatus like fire detection and remediation equipment and personnel safety monitoring equipment.

In some embodiments, utility services such as electrical power, data communication service, chemical supply, inert gas supply, compressed air, deionized water, chilled water, chemical drains, waste removal service and the like can be automatically connected, such as, for example, via a multi-port flange.

Figure 3:
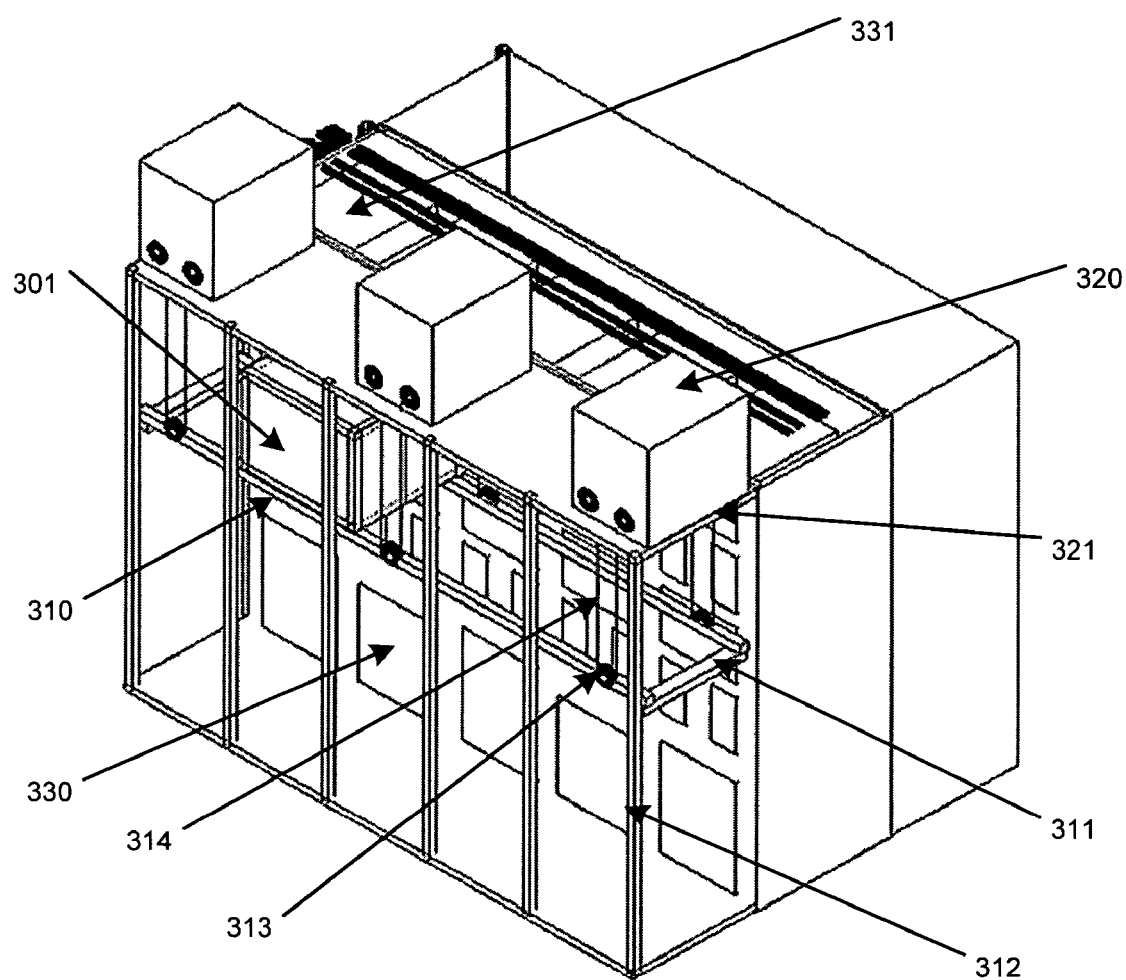
FIG. 3 illustrates a steel member lattice supported elevation cleanspace deployed next to a straight edged multilevel fab.

Referring now to FIG. 3, according to various embodiments of the present invention, multiple different manners of elevating the cleanspace may also be employed. For example, as opposed to the previously discussed elevator 101, in some embodiments, the elevator 301 in FIG. 3 can be affixed to the frame of a vertical cleanspace fabricator. In such embodiments, a frame 312 can support a set of elevator motors, 320, at the top of the fabricator 321. The elevator body 301, which can be very similar to the internal design depicted in FIG. 4, can then ride on a frame, 311 in the horizontal dimension. This frame, 311, can be elevated in its entirety by a series of motor driven cables 313 and pulleys 314. Access to the tool bodies 331, can be had through panels 330 once the elevator 301 is aligned to the proper location in front of the cleanspace and once the internal cleanspace has achieved a desired level of cleanness.

Figure 2:
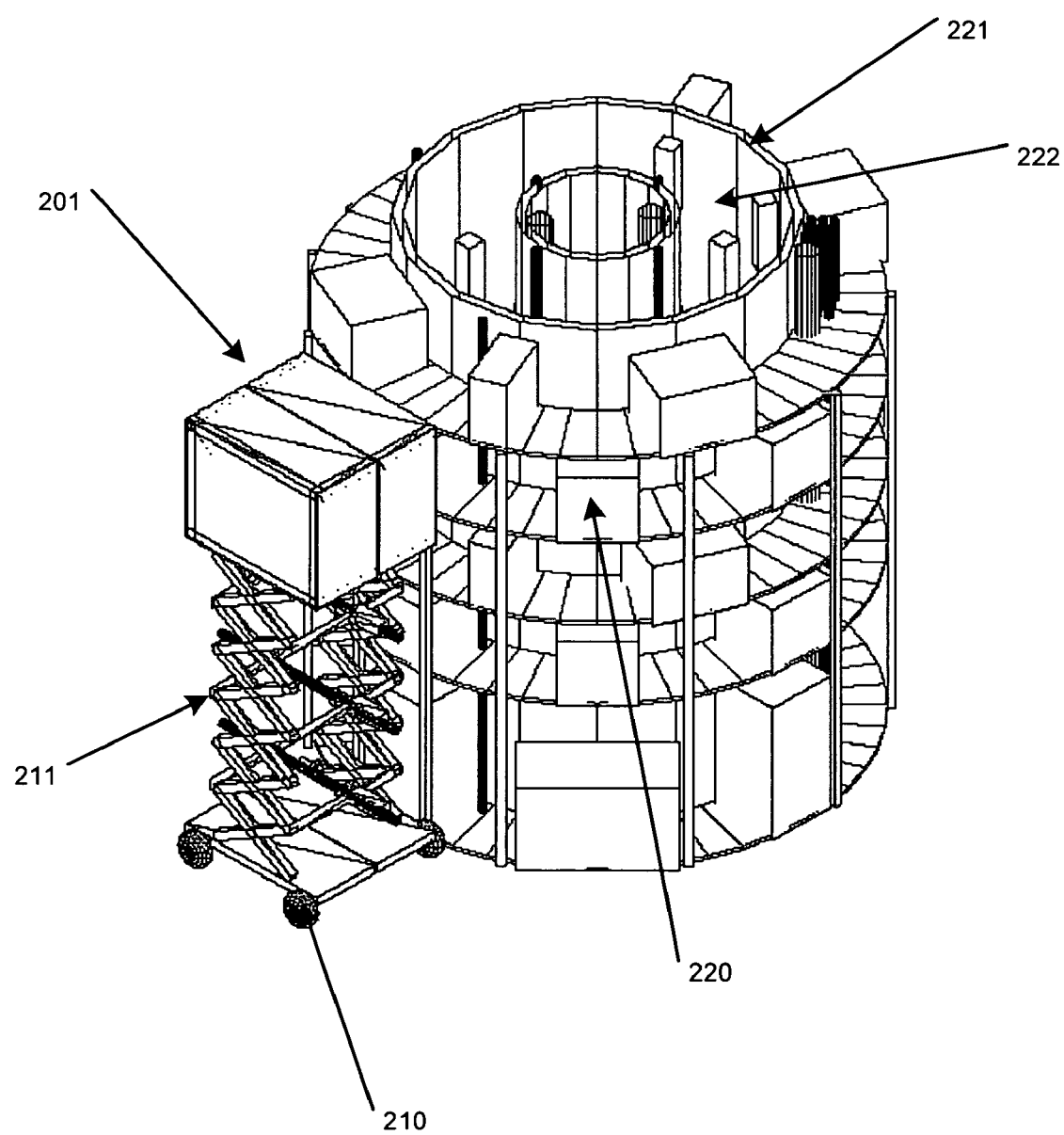
FIG. 2 illustrates a stand alone elevation cleanspace deployed next to a curved edged multilevel fab.

FIG. 2 illustrates how, in some embodiments, a vertical cleanspace fabricator can assume different shapes, including for example a curved, 222, or otherwise arcuate shape. Furthermore, FIG. 2 demonstrates that tool bodies 220 can reside in a space external to the primary cleanspace and not in a secondary cleanspace. In such embodiments, flexible movement capability of the cleanspace elevator 201 with a motor driven wheeled system 210 can be employed. Elevation can be achieved in any known manner, such as, for example, via hydraulic lift, scissor jack lift, electric or air driven hoist, robotics, stepper motors and gearing or other mechanical means.

Figure 5:
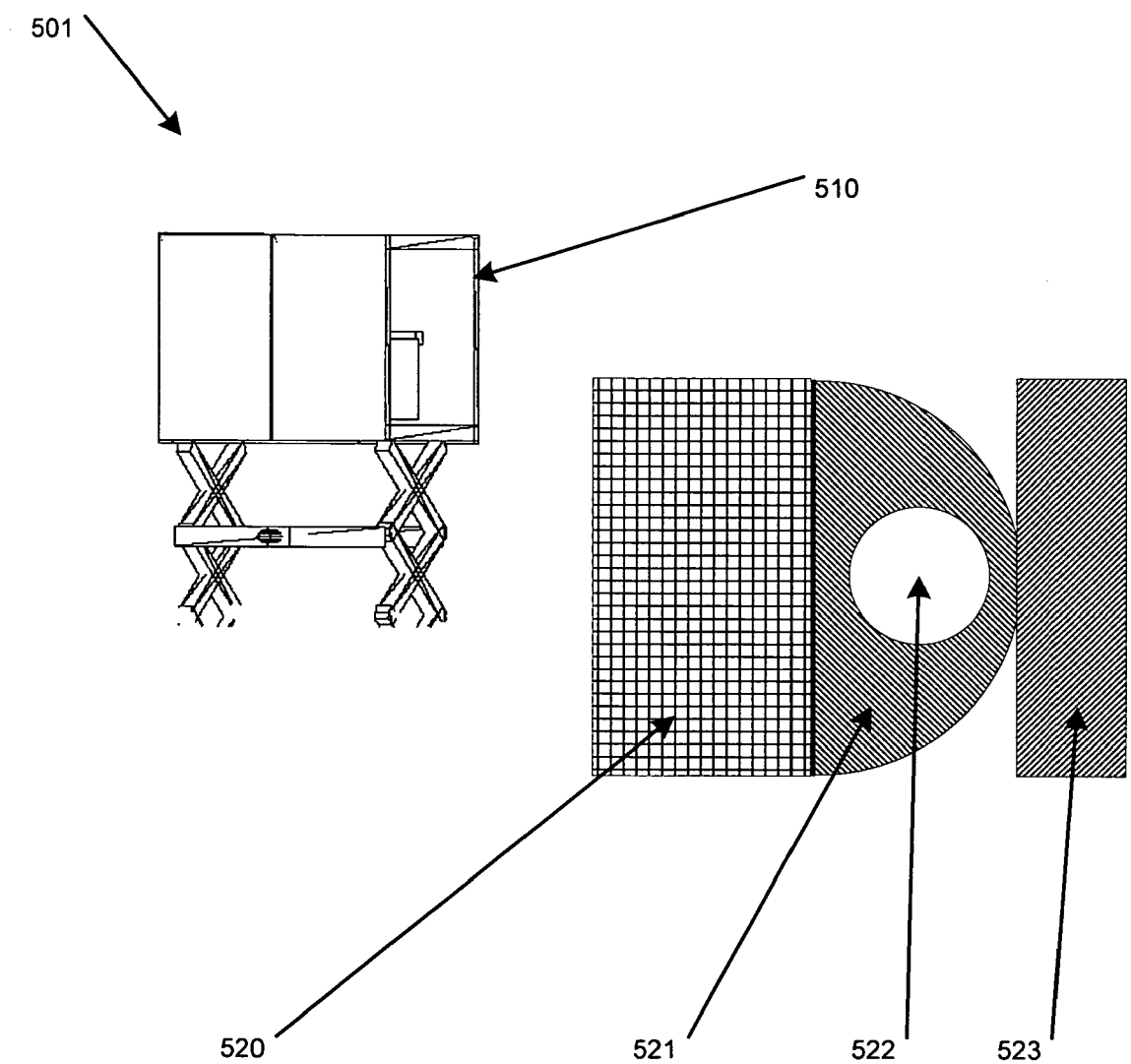
FIG. 5 illustrates a close up of edge sealing of the elevation cleanspaces.

Referring now to FIG. 5, some embodiments include a sealing surface which mates up the elevator body (work area module) 501, with the fabricator external wall 522. Since the work area module 501 can include apparatus to clean the airspace in the interior of the work area module 501, an important aspect of some embodiments can include flexible means which limits or eliminate the possibility of non-cleaned air from the general environment from leaking into the work area module 501.

Two exemplary mechanisms will be described to maintaining the integrity of the cleanspace environment within the elevator workspace area 501. The first mechanism can include an air cleaning system which maintains a positive air pressure for the internal space of the elevator 501. This first mechanism has the property of sweeping out contaminates from regions that are not completely sealed.

A second mechanism can include an edge seal 521 for maintaining the integrity of the cleanspace in the work area module 501. The edge of the opening of the elevator space, 510, can be made of a Cleanroom consistent material with flexibility. Such material can be formed into an edge seal, 521 For example, a void in the flexible material of part 521, as shown as item 522 can allow the material to be pressed up against the walling of the fabricator external wall, 523 and therefore make a better seal.

Figure 6:
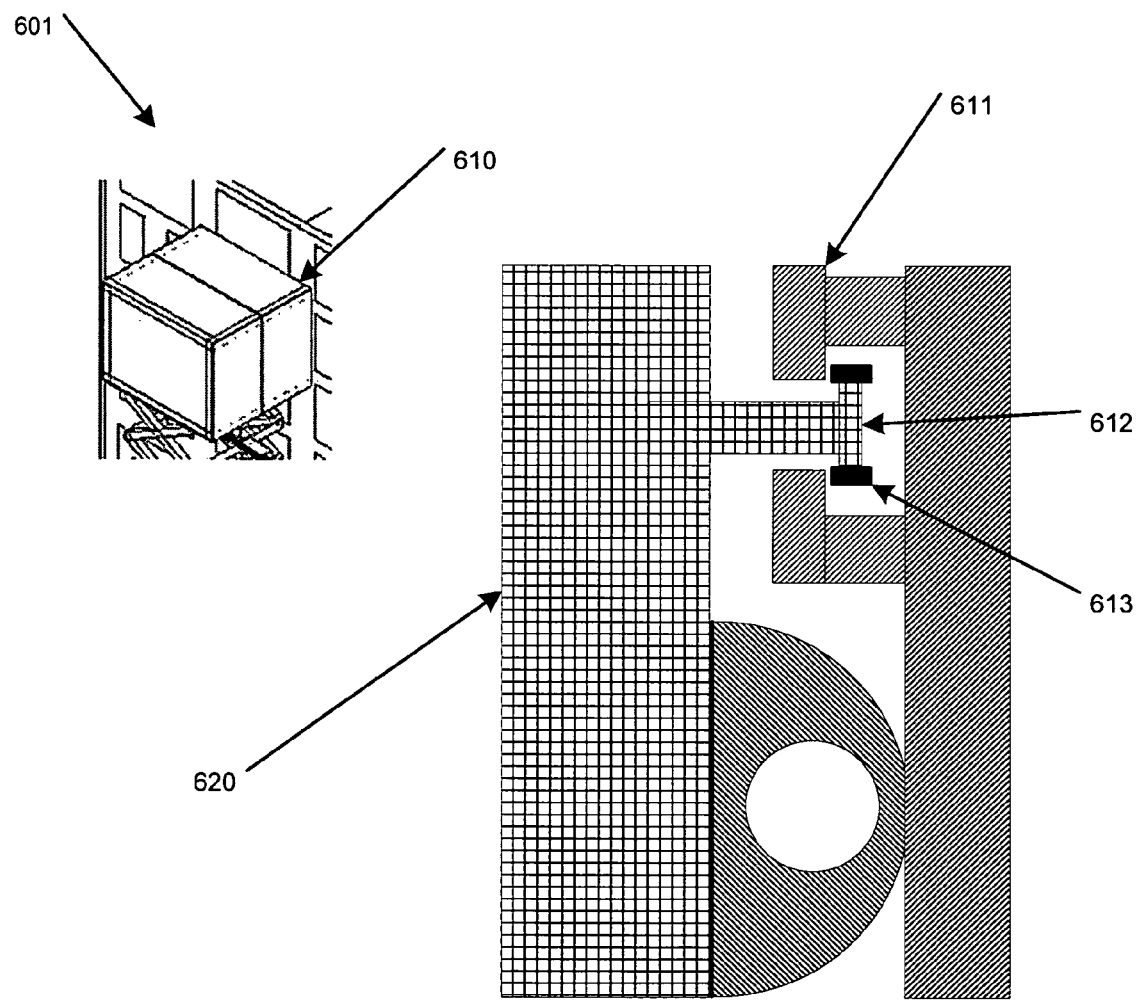
FIG. 6 illustrates a close up of a cleanspace and transport.

Since an elevator by its very nature can service elevated heights, it can be prudent for elevators of the type shown in FIG. 1 to be equipped with the capability to connect with the fabricator support structure in a flexible yet strong manner. Referring now to FIG. 6, such a structure is shown. In the exemplary embodiments illustrated in FIG. 6, an elevator body, 601, has a sealing edge 610, capable of connecting against the external face of the fabricator space.

In a region near this seal 610, the fabricator space can have an external rail slot mounted on the face of the wall. In some embodiments, a slot can begin at the second level of an elevator space. Therefore, when the elevator 501 is being put into service, it can be aligned with a desired position in the horizontal dimension. A tab, 612, with wheels, 613, on the elevator can be aligned with the slot, 611, and the elevator can be elevated to its desired vertical position. If there happened to be a deflection of the elevator body away from the fab wall, it can then be captured by this slot and tab and not deflect significantly for safety reasons.

In some embodiments, as a processing tool is connected, various aspects of tool automation electronics can monitor the connection and determine when the connections are in a safe operating mode. For example fire detection and remediation equipment can be included in the work space module 501. In addition, tool automation electronics can communicate with a tool body and to the tool chassis to identify a state that the connections and supply conduits are in.

In still another aspect of the invention, in some embodiments, control automation can be contained within one or more of: the elevator apparatus and the work space module 501 for various aspects of the operation of the systems and apparatus described herein. It is also within the scope of the present invention to automatically monitor and control multiple states related to the work space module 501 via electronic circuitry included in the work space module 501. Such states can include, by way of example, a physical location of the work space module 501 and whether an associated chassis at a tool location is in an extended or closed state.

Therefore, for example, if a processing tool and chassis are in a closed state, a technical operator can issue a command to the chassis to move to an extended position in order to provide access to a tool mounted to the chassis as a work area module becomes proximate to the chassis. Such communication can occur through a control panel or through wireless communication to the chassis through circuitry comprising wireless receivers. Accordingly, control of the work space module 501, an elevator, a processing tool, or any of the other systems describe herein can be accomplished with any known machine controller technology, including for example a processor running executable software and generating a human readable interface.

In some embodiments, a command to move to the chassis to an extended location can also initiate, amongst other algorithmic functions, a check for the status of utilities connections. It is also within the scope of this invention to require any such utility connections to be rendered into a state of disconnect before the chassis can proceed to an extended position.

Similarly, in some embodiments, prior to operations such as extension of a chassis, processing steps can determine that a tool body did not contain any substrates prior to extension of the chassis. It is also within the scope of the present invention for communication modes included within the chassis to communicate with fabrication wide automation systems for purposes such as tracking the location of substrates; tracking the identity of tools; and tracking the status of tools. If connections to a tool and chassis are in a proper state then an elevator can approach the tool location of a particular chassis and the chassis can move into an extended position allowing, for example, for the removal of a tool contained therein and replacement with another tool body.

As described above, according to various embodiments of the present invention, each tool body 501 can be individually removed and replaced in a standardized process and without requiring the removal of adjacent tool bodies. In addition, some embodiments provide for a fabrication tool to be maintained within a clean space environment during any of: removal, repair, transport and replacement. In still another aspect, some embodiments provide for the automatic removal of a tool from a first tool location and automatic placement of the tool in a second tool location, wherein all utilities connections are also automatically disconnected and reconnected accordingly.

Some embodiments of the present invention which relate to the specific application of semiconductor fabrication have been described in order to better demonstrate various useful aspects of the invention. However, such exemplary descriptions are not meant to limit the application of the inventive concepts described herein in any way. Embodiments may therefore include, for example, applications in research and generation of: pharmaceutical products, nanostructure products and other applications which benefit from the availability of cleanspace and multiple processing tools.

Glossary of Selected Terms

Automation: The techniques and equipment used to achieve automatic operation, control or transportation.

Boundaries: A border or limit between two distinct spaces—in most cases herein as between two regions with different air particulate cleanliness levels.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Fab (or fabricator): An entity made up of tools, facilities and a cleanspace that is used to process substrates.

Flange: A protruding rim, edge, rib, or collar, used to strengthen an object, hold it in place, or attach it to another object. Typically herein, also to seal the region around the attachment.

Horizontal: A direction that is, or is close to being, perpendicular to the direction of gravitational force.

Logistics: A name for the general steps involved in transporting a job from one processing step to the next. Logistics can also encompass defining the correct tooling to perform a processing step and the scheduling of a processing step.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Process: A series of operations performed in the making or treatment of a product—Herein primarily on the performing of said operations on substrates.

Substrates: A body or base layer, forming a product, that supports itself and the result of processes performed on it.

Tool (also sometimes referred to as a Fabrication Tool or Processing Tool): A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Utilities: A broad term covering the entities created or used to support fabrication environments or their tooling, but not the processing tooling or processing space itself. This may include electricity, gasses, air flows, chemicals (and other bulk materials) and environmental controls (e.g., temperature).

Vertical: A direction that is, or is close to being, parallel to the direction of gravitational force.

Work Area Module: a clean space defined by walls into a unit.

While the invention has been described in conjunction with specific embodiments, it is evident that many alternatives, modifications and variations will be apparent to those skilled in the art in light of the foregoing description.

Accordingly, this description is intended to embrace all such alternatives, modifications and variations as fall within its spirit and scope.

What is claimed is:

1. An apparatus for transporting a fabricator tool to or from a cleanspace environment, the apparatus comprising:
   a work area module defined in three dimensions by walls;
   a connecting surface connectable to a tool location in a multilevel fabricator, said connecting surface comprising a perimeter defining an opening in at least one wall containing the work area, said opening of sufficient dimensions to allow the fabricator tool to pass through the opening;
   support structure supporting the work area module and comprising automation for transporting the work area module in at least one of a horizontal plane and a vertical plane, each plane relative to the cleanspace environment; and
   a seal between the perimeter defining the opening and a surface comprising the cleanspace environment, said seal operative to preserve the integrity of an atmosphere defined by the cleanspace environment and an environment within the work area module.

2. The apparatus of claim 1 wherein the support structure additionally comprises wheels mounted proximate to a lowest portion of the support structure and functional to provide movement in the horizontal plane and mechanization attached to the wheels and functional to elevate the work area module, thereby providing movement in the vertical plane.

3. The apparatus of claim 1 wherein the automation for transporting the work area module on a horizontal plane and a vertical plane relative to the cleanspace environment comprises multiple rails arrayed in a matrix along vertical and horizontal axes and a drive unit operative to provide locomotion along at least one rail.

4. The apparatus of claim 1 where the work area module comprises a clean room.

5. The apparatus of claim 1 additionally comprising mechanized apparatus operative to position the fabricator tool in an operation location.

6. The apparatus of claim 1 wherein the work area module additionally comprises utility support for at least one of: tool diagnosis and repair and comprising supply of one or more of: electricity, inert gas flow, chemicals, and chemical drain tanks.

7. The apparatus of claim 1 additionally comprising fire detection and remediation equipment within one or more of: the work area module and a tool body location.

8. The apparatus of claim 1 wherein the automation for transporting the work area module in a vertical plane relative to the cleanspace environment comprises a series of extension jacks activatable via motorized lead screw assemblies.

9. The apparatus of claim 1 wherein the automation for transporting the work area module in a vertical plane relative to the cleanspace environment comprises pulleys and cables attached to motorized lifting units.

10. The apparatus of claim 1 wherein the automation for transporting the work area module in a vertical plane relative to the cleanspace environment comprises a motorized arm with telescoping length capability.

11. The apparatus of claim 1 additionally comprising circuitry functional to provide one or more of: wired or wireless electronic communication between at least two of: a fabricator in the work area module, a fabricator tool adjacent to the work area module and cleanspace fabricator automation.

12. The apparatus of claim 1 additionally comprising circuitry functional to provide one or more of: wired or wireless electronic communication indicating a status of a fabricator tool to fab automation.

13. The apparatus of claim 1 additionally comprising electronically interlocked safety systems functional to control the ability of a fabricator tool body to be moved into or out of the work area module at various positions.

14. The apparatus of claim 1 additionally comprising electronic sensors mounted to the work area module and functional to monitor the environment of the work area module for the presence of one more of: the presence of chemicals, temperature, moisture, and electrical charge.

15. The apparatus of claim 1 additionally comprising a control panel with user activatable controls, wherein said user activatable controls are operable to provide one or more of: vertical movement of the work area module and horizontal movement of the work area module.

16. The apparatus of claim 1 additionally comprising an identification apparatus comprising one or more of: a radio frequency identification tag and a scannable symbol.

17. A method of facilitating placement of a fabrication tool in a fabricator, the method comprising the steps of:
   elevating a work area module defined in three dimensions by walls;

transporting the work area module in a horizontal plane to a tool location in a fabricator comprising a multilevel matrix of separate cleanspaces for each respective tool location;

sealing a connecting surface comprising the work area module to a tool location in the fabricator, said connecting surface comprising a perimeter defined by an opening in at least one wall containing the work area, said opening of sufficient dimensions to allow the fabricator tool to pass through the opening; and maintaining a cleanspace environment about a fabricator tool while the fabricator tool is transported between the work space module and the tool location.

18. The method of claim 17 additionally comprising the step of performing at least one action comprising a manufacturing process for one or more of: a semiconductor; photonic; microelectronic machines; biological composition and nanotechnology device.

19. The method of claim 17 additionally comprising the steps of:

transporting a human operator to the tool location;

removing the tool from the tool location into the work area module;

performing a repair on the tool in the work area module; and replacing the tool into the tool location.

20. Claim 17 additionally comprising the step of:

automatically controlling the position of the work area module in relation to a particular tool location;

automatically placing a fabricator tool in a tool location and connecting one or more utility services to the fabricator tool, wherein the utility services comprise at least one of: electricity, inert gas flow, chemicals, and chemical drain tanks.

\* \* \* \* \*